US 6,611,949 B2
Aug. 26, 2003

(54) PATH FILTERING FOR LATCH-BASED SYSTEMS

(75) Inventors: Matthew Becker, Maxwell AFB, AL (US); Eileen You, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 10/007,560

(22) Filed: Nov. 8, 2001

(65) Prior Publication Data

US 2003/0085396 A1 May 8, 2003

(51) Int. Cl.[7] .................................................. G06F 9/45
(52) U.S. Cl. ................... 716/6; 716/6; 716/10; 716/16
(58) Field of Search ................ 257/10; 714/4, 714/6, 5; 364/578; 395/500; 371/27

(56) References Cited

U.S. PATENT DOCUMENTS

| | | | |
|---|---|---|---|
| 5,095,454 A | * | 3/1992 | Huang .......................... 364/578 |
| 5,323,401 A | * | 6/1994 | Maston .......................... 371/27 |
| 5,392,227 A | * | 2/1995 | Hiserote ....................... 364/578 |
| 5,544,071 A | | 8/1996 | Keren et al. |
| 5,790,830 A | * | 8/1998 | Segal .......................... 395/500 |
| 5,815,655 A | | 9/1998 | Koshiyama |
| 5,966,521 A | | 10/1999 | Takeuchi et al. |
| 6,058,252 A | * | 5/2000 | Noll et al. .................... 395/500 |
| 6,353,916 B1 | | 3/2002 | Kuwayama |
| 6,405,348 B1 | | 6/2002 | Fallah-Tehrani et al. |

OTHER PUBLICATIONS

Kiani, Bijan, and Hill, Anthony, "Static Crosstalk Analysis Assures Silicon Success," <http://www.eedesign.com/features/exclusive/OEG20020604S0047>, printed on Jun. 17, 2002.

Schulz, Steven E., "Focus Report: Timing Analysis," <http://www.eedesign.com/editorial/2000/focusreport0008.html>, printed on Jun. 17, 2002.

"Silicon Smart PMC™," <http://www.siliconmetrics.com/Products/PMC.pdf>, printed on Jun. 17, 2002.

"Noise–aware Timing Analysis," <http://www.cadence.com/whitepapers/noiseAware.html>, printed on Jun. 17, 2002.

* cited by examiner

Primary Examiner—Hoai Ho
Assistant Examiner—Thinh Nguyen
(74) Attorney, Agent, or Firm—Kilpatrick Stockton LLP

(57) ABSTRACT

A method and a system for static timing analysis of a latch-based circuit. A netlist data structure represents the latch-based circuit. The method statically analyzes the netlist data structure and produces timing information for signal paths within the latch-based circuit. The signal paths are filtered using path termination information, which specifies where paths end. The path termination information distinguishes a first signal path that terminates at a latch from a second signal path that flows through that same latch.

16 Claims, 3 Drawing Sheets

PATH FILTERING FOR LATCH-BASED SYSTEMS

BACKGROUND OF THE INVENTION

1. Field of the Invention

This invention generally relates to computer-aided design of integrated circuits and, more particularly, to path filtering mechanisms for static timing analysis.

2. Description of the Related Art

As tens of millions of gates are manufactured on wafers, software modeling of digital circuits is essential. Prototyping such a large and complex circuit is often prohibitively expensive and time-consuming. If a flaw is found in the prototyped circuit, the gates and interconnections are so small that probing the chip and determining a correction is almost impossible. Today's Very Large Scale Integrated (VLSI) circuit designers, therefore, use software modeling to design and verify a circuit before fabrication.

The software modeling of circuits often includes a static timing analysis. A static timing analysis sums and compares delays relative to a pre-defined clock. The static timing analysis, for example, assures the designer that data does not arrive too late and remains stable long enough to be latched. A static timing analysis, however, is exhaustive—all paths within a circuit are analyzed for timing errors. Because a VLSI chip design has millions of interconnected gates, a static timing analysis traces millions of paths within the circuit. Some of these traced paths, however, may be architecturally false—that is, paths that do not exist, or will never occur, within the physical circuit. Some of these traced paths may also be of lesser interest to the designer and, thus, "mask" paths of higher interest.

Because the static timing analysis exhaustively traces all paths within a circuit design, static timing analysis tools include a filtering mechanism. The primary use of path filtering is to analyze a particular section of logic to efficiently correct errors. Static timing analyzers typically report only the top violating paths. Fixing the top error may leave a slightly better timing violation uncorrected. In fact the fix may actually make the masked path worse. To combat this a circuit designer will path filter the top violators to figure out a fundamental fix for an entire set of timing errors that may be related. Path filtering is used to identify this set of related errors.

The prior art filter mechanisms, however, do not work properly with latch-based circuit designs. A latch path that terminates at a latch exactly aliases with another latch path that flows through the latch while in a transparent mode. Current filtering algorithms, however, do not distinguish between latch paths sharing segments. Filtering mechanisms, therefore, similarly filter all latch paths, whether terminating at a latch or whether flowing through the latch.

There is, accordingly, a need in the art for filtering mechanisms for latch-based digital circuits that distinguish between paths that end at a latch from paths that flow through the latch, and for filtering mechanisms that are simple to use and quick to implement within static timing analyzers.

BRIEF SUMMARY OF THE INVENTION

The aforementioned problems are solved by the present invention. The present invention describes an enhancement to existing path filtering mechanisms used in a static timing analysis. The present invention adds path termination information to path filtering statements. When paths are filtered during a static timing analysis, the addition of path termination information would specify where a path ends. The path termination information, therefore, distinguishes a path terminating at a transparent latch from another path flowing through the transparent latch. The present invention thus allows shorter segments to be filtered without filtering longer paths through latches.

BRIEF DESCRIPTION OF THE SEVERAL VIEWS OF THE DRAWINGS

These and other features, aspects, and advantages of the present invention are better understood when the following Detailed Description of the Invention is read with reference to the accompanying drawings, wherein.

DETAILED DESCRIPTION OF THE INVENTION

One embodiment of the present invention comprises methods of analyzing digital circuits. One method statically analyzes a model of a digital circuit. Timing information is produced for signal paths within the digital circuit. The method then filters a signal path that ends at a transparent latch from another signal path that flows through the transparent latch to reduce the number of paths analyzed. The signal paths could be filtered using termination information. The signal paths could also be filtered using continuation information. The termination information and the continuation information distinguish the signal path that ends at the transparent latch from the other signal path that flows through the transparent latch. The termination information and the continuation information allow a user, or automatic recognition software, to differentiate two paths at a clocking point.

Another embodiment comprises a latch-based circuit represented as a netlist data structure. The netlist data structure is statically analyzed, and timing information is produced for signal paths within the latch-based circuit. The signal paths are filtered using at least one of path termination information and continuation information. The termination information specifies a termination point of a signal path that ends at.a latch. The path termination information distinguishes a first signal path that terminates at the latch from a second signal path that flows through the latch during a transparent mode.

A further embodiment comprises a computer system having a static timing analyzer stored in memory, a filter mechanism stored in memory, and a microprocessor. The static timing analyzer produces timing information for signal paths in a digital circuit. The filter mechanism filters a first signal path that ends at a transparent latch from another signal path that flows through the transparent latch. The filtering mechanism thus reduces the number of paths analyzed. The microprocessor communicates with the memory and is capable of generating timing behavior of the digital circuit.

Figure 1:
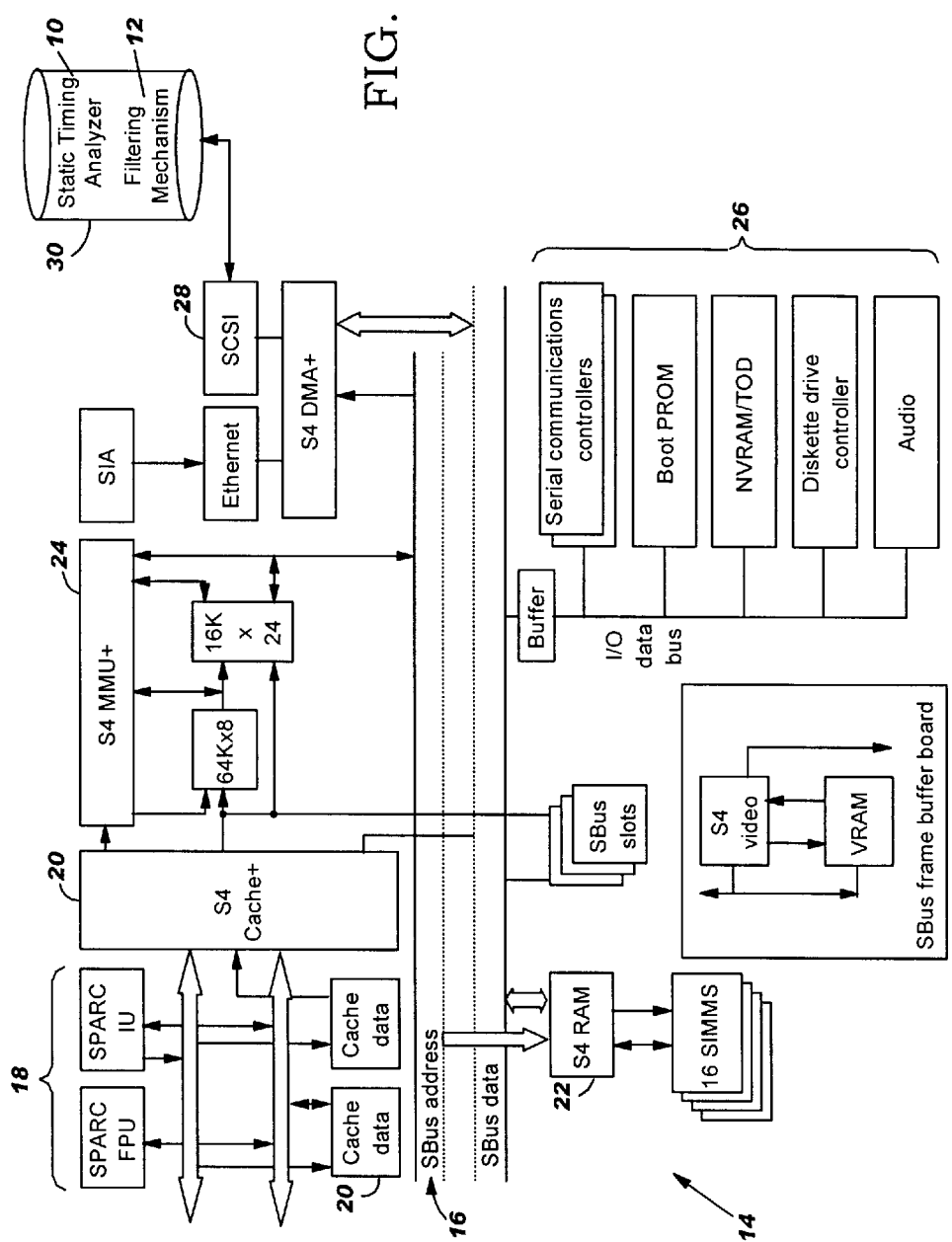
FIG. 1 depicts a possible operating environment for one embodiment of the present invention.

FIG. 1 depicts one operating environment for one embodiment of the present invention. FIG. 1 shows a static timing analyzer 10 and a filtering mechanism 12 interfacing with a computer system 14. The computer system 14 includes a bus 16 communicating information between a central processor unit 18, cache memory 20, Random Access Memory 22, a Memory Management Unit 24, one or more input/output controller chips 26, and a Small Computer System Interface (SCSI) controller 28. The SCSI controller 28 interfaces with SCSI devices, such as a mass storage hard disk drive 30. The static timing analyzer 10 and the filter mechanism 12 are shown stored within the mass storage hard disk drive 30, although those of ordinary skill in the art recognize each could reside and operate within one or more RAM/ROM memory devices. Those of ordinary skill in the art also understand that the program, processes, methods, and systems described in this patent are not limited to any particular computer system or computer hardware.

Those of ordinary skill in the art also understand the central processor unit 18 is typically a microprocessor. Sun Microsystems, for example, designs and manufactures high-end 64-bit and 32-bit microprocessors for networking and intensive computer needs (Sun Microsystems, Inc., 901 San Antonio Road, Palo Alto, Calif. 94303, www.sun.com). Advanced Micro Devices (Advanced Micro Devices, Inc., One AMD Place, P.O. Box 3453, Sunnyvale, Calif. 94088-3453, 408.732.2400, 800.538.8450, www.amd.com) and Intel (Intel Corporation, 2200 Mission College Blvd., Santa Clara, Calif. 95052-8119, 408.765.8080, www.intel.com) also manufacture various families of microprocessors. Other manufacturers include Motorola, Inc. (1303 East Algonquin Road, P.O. Box A3309 Schaumburg, Ill. 60196, www.Motorola.com), International Business Machines Corp. (New Orchard Road, Armonk, N.Y. 10504, (914) 499–1900, www.ibm.com), and Transmeta Corp. (3940 Freedom Circle, Santa Clara, Calif. 95054, www.transmeta.com). While only one microprocessor is shown, those skilled in the art also recognize multiple processors may be utilized. Those skilled in the art further understand that the program, processes, methods, and systems described in this patent are not limited to any particular manufacturer's central processor.

The preferred operating system is the SOLARIS™ operating system (SOLARIS™ is a registered trademark of Sun Microsystems, Inc.). Those skilled in the art also recognize many other operating systems are suitable. Other suitable operating systems include UNIX® (UNIX® is a registered trademark of the Open Source Group, www.opensource.org), Linux, WINDOWS® and WINDOWS NT® (WINDOWS® and WINDOWS NT® are registered trademarks of Microsoft Corporation, One Microsoft Way, Redmond, Wash. 98052-6399, 425.882.8080, www.Microsoft.com), and Mac® OS (Mac® is a registered trademark of Apple Computer, Inc., 1 Infinite Loop, Cupertino, Calif. 95014, 408.996.1010, www.apple.com). Those of ordinary skill in the art again understand that the program, processes, methods, and systems described in this patent are not limited to any particular operating system.

Figure 2:
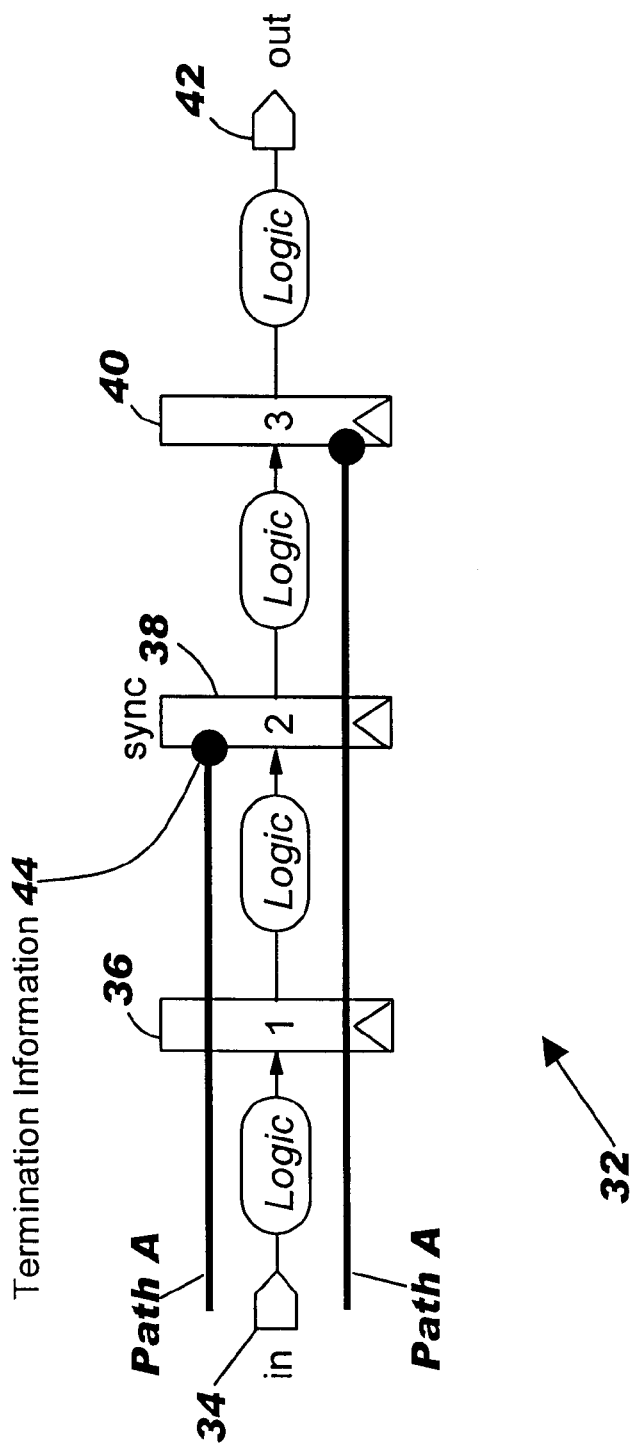
FIG. 2 is a schematic of a latch-based digital circuit incorporating the present invention.

FIG. 2 is a schematic of a latch-based digital circuit 32 incorporating an embodiment of the present invention. The latch-based digital circuit 32 includes an input 34, three latches 36, 38, and 40 separated by combinational logic, and an output 42. FIG. 2 also illustrates latch path "A" and latch path "B." Latch path A flows from the input 34, through combinational logic, through the latch 36, through more combinational logic, and terminates at the latch 38. Latch path B has the same beginning segment, but instead, continues through transparent latch 38, through more combinational logic, and ends at the latch 40. Although latch path A terminates at the latch 38, latch path A also aliases with the latch path B flowing through the latch 38. The present invention overcomes this aliasing problem. When paths are filtered during a static timing analysis, the addition of termination information 44 would specify when a path ends. Termination information 44, therefore, distinguishes path A, terminating at the transparent latch 38, from path B flowing through the transparent latch 38. The present invention would then allow the shorter segment path A to be filtered, thus, revealing the longer path B. Although FIG. 2 shows path A and path B with the same starting point, the longer path B need not start at the same point as the shorter segment path A. The present invention does not require that aliasing paths have the same starting point.

Figure 3:
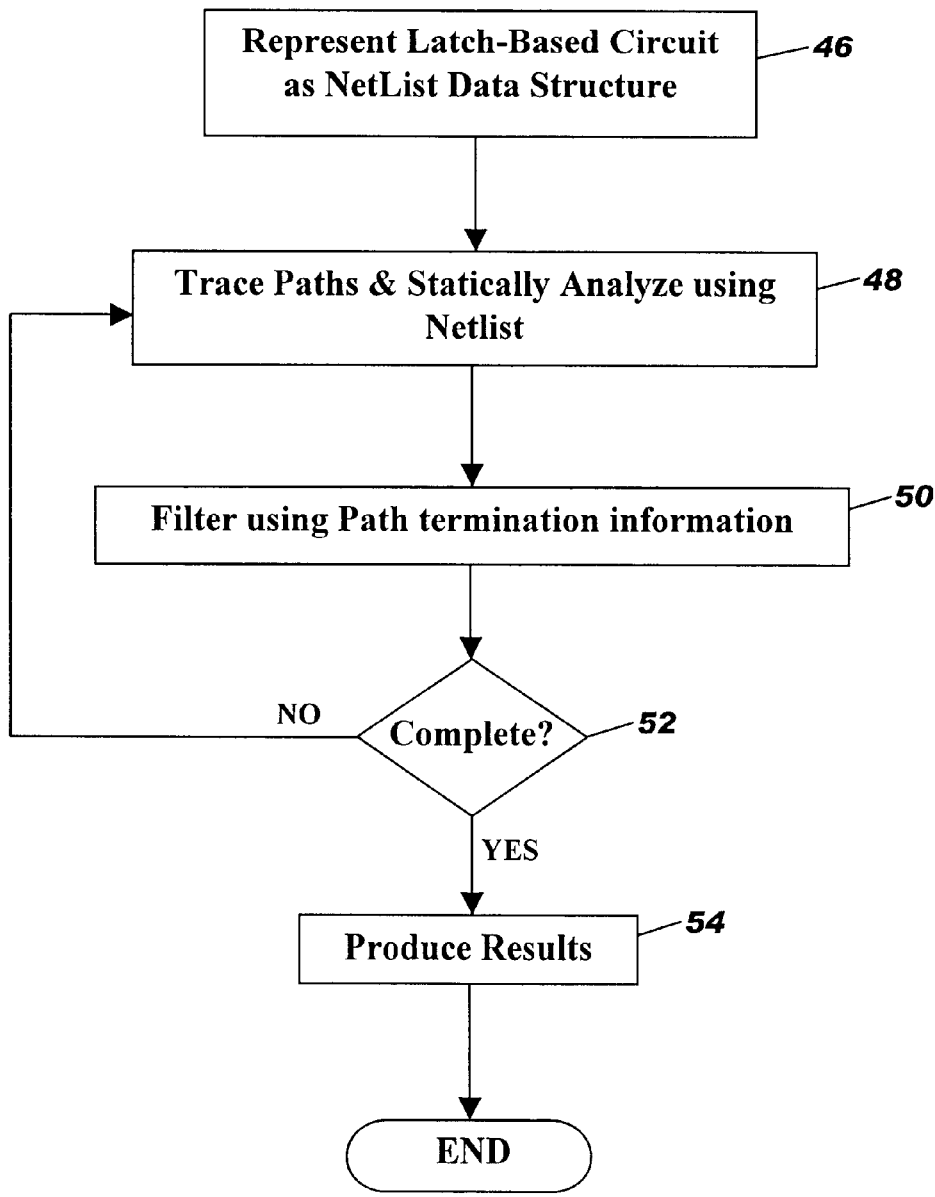
FIG. 3 is a flowchart illustrating a method of analyzing digital circuits according to the present invention.

FIG. 3 is a flowchart illustrating a method of analyzing digital circuits according to the present invention. A latch-based circuit is represented as a netlist data structure (Block 46). The netlist data structure reflects the latch-based circuit by reciting connections among circuit components and/or circuit blocks. The paths within the circuit, represented by the netlist data structure, are then statically analyzed (Block 48) by the static timing analyzer (shown as reference numeral 10 in FIG. 1). The static timing analyzer checks internal and external timing constraints and produces timing information for signal paths within the latch-based circuit. As those of ordinary skill recognize, often times architecturally-false paths may exist within the netlist data structure, or some paths may mask underlying paths of greater interest. The signal paths are filtered using path termination information (Block 50). The path termination information would permit a user to specify and to filter logically-false paths and paths of lesser interest. The path termination information would-be added to path filtering statements common to static timing analysis tools. The paths could be filtered between a user-specified beginning point and a user-specified ending point. The path termination information specifies the termination point of a latch path in the circuit. The path termination information would distinguish a signal path that terminates at the latch from a second signal path that flows through the latch during a transparent mode. If the static analysis is complete (Block 52), the timing results are produced (Block 54) in a format desired by the user.

The methods described herein may be physically embodied on or in a computer-readable medium. This computer-readable medium includes CD-ROM, DVD, tape, cassette, floppy disk, memory card, and a large-capacity disk (such as IOMEGA®, ZIP®, JAZZ®, and other large-capacity memory products) (IOMEGA®, ZIP®, and JAZZ® are registered trademarks of Iomega Corporation, 1821 W. lomega Way, Roy, Utah 84067, 801.332.1000, www.iomega.com). This computer-readable medium, or media, could be distributed to end-users, licensees, and assignees. These types of computer readable media, and other types not mentioned here but considered within the scope of the present invention, allow the methods to be easily disseminated.

While this invention has been described with respect to various features, aspects, and embodiments, those skilled and unskilled in the art will recognize the invention is not so limited. Other variations, modifications, and alternative embodiments may be made without departing from the spirit and scope of the following claims.

What is claimed is:

1. A method, comprising:

statically analyzing a model of a digital circuit;

producing timing information for a plurality of signal paths within the digital circuit; and filtering the plurality of signal paths using termination information, the termination information specifying a termination point of a latch path in the circuit.

2. A method according to claim 1, wherein the plurality of signal paths comprises a first signal path that ends at a transparent latch and a second signal path that flows through the transparent latch.

3. A method according to claim 2, wherein the step of filtering further comprises filtering the first signal path from the second signal path.

4. A method according to claim 2, wherein the step of filtering further comprises distinguishing the first signal path from the second signal path.

5. A method according to claim 3, further comprising reducing the number of paths analyzed.

6. A method according to claim 1, wherein the step of filtering further comprises filtering between a user-specified beginning point and a user-specified ending point.

7. A method, comprising:

representing a latch-based circuit as a netlist data structure;

statically analyzing the netlist data structure;

producing timing information for signal paths within the latch-based circuit; and filtering the signal paths using path termination information, wherein the path termination information specifies a termination point of a signal path that ends at a latch, and wherein the path termination information distinguishes a first signal path that terminates at the latch from a second signal path that flows through the latch during a transparent mode.

8. A computer system, comprising:

a static timing analyzer stored in memory, the static timing analyzer producing timing information for signal paths in a digital circuit;

a filter mechanism stored in memory, the filter mechanism filtering the signal paths using path termination information, the path termination information distinguishing a first signal path that ends at a transparent latch from another signal path that flows through the transparent latch, the filtering mechanism reducing the number of signal paths analyzed; and a microprocessor communicating with the memory, the microprocessor capable of generating timing behavior of the digital circuit.

9. A method according to claim 1, further comprising filtering the plurality of signal paths using continuation information.

10. A method according to claim 7, further comprising reducing the number of paths analyzed.

11. A method according to claim 7, wherein said filtering comprises filtering from a user-specified beginning point.

12. A method according to claim 7, wherein said filtering comprises filtering to a user-specified ending point.

13. A method according to claim 7, further comprising filtering the plurality of signal paths using continuation information.

14. A computer system according to claim 8, wherein said filtering comprises filtering from a user-specified beginning point.

15. A computer system according to claim 8, wherein said filtering comprises filtering to a user-specified ending point.

16. A computer system according to claim 8, further comprising filtering the plurality of signal paths using continuation information.

* * * * *